United States Patent [19]

Ernsberger

[11] 4,396,666
[45] Aug. 2, 1983

[54] SOLDERABLE CONDUCTIVE EMPLOYING AN ORGANIC BINDER

[75] Inventor: Craig N. Ernsberger, Edwardsburg, Mich.

[73] Assignee: CTS Corporation, Elkhart, Ind.

[21] Appl. No.: 317,235

[22] Filed: Nov. 2, 1981

[51] Int. Cl.³ .............................. B32B 3/00; B05D 3/02
[52] U.S. Cl. ...................................... 428/208; 228/121; 252/511; 252/514; 427/226; 427/229; 428/209; 428/210; 428/328; 428/409; 428/413; 428/417; 428/418; 428/901; 428/551
[58] Field of Search ............... 252/514, 511; 428/328, 428/901, 551, 208, 209, 210, 409, 418, 417, 413; 228/121, 122; 427/226, 229

[56] References Cited

U.S. PATENT DOCUMENTS

| | | | |
|---|---|---|---|
| 2,700,623 | 1/1955 | De Rose et al. | 143/23 |
| 3,671,464 | 6/1972 | Gilchrist | 252/511 |
| 3,686,139 | 8/1972 | Lubin | 252/511 |
| 3,767,519 | 10/1973 | Kojima | 428/428 |
| 3,779,807 | 12/1973 | Taylor | 427/226 |
| 3,832,242 | 8/1974 | Cuthbert | 148/24 |
| 3,895,973 | 7/1975 | Stayner | 148/25 |
| 3,915,729 | 10/1975 | Eustice | 106/268 |
| 3,944,123 | 3/1976 | Jacobs et al. | 228/223 |
| 3,986,889 | 10/1976 | Muntzer | 106/283 |
| 4,025,669 | 5/1977 | Greenstein | 427/226 |
| 4,243,460 | 1/1981 | Nagler | 428/328 |
| 4,247,594 | 1/1981 | Shea | 428/328 |

Primary Examiner—Ellis P. Robinson
Attorney, Agent, or Firm—John A. Young; Larry J. Palguta

[57] ABSTRACT

A conductive layer (13) adhesively joined to an electrically inert substrate (10) by an organic binder component. The organic binder consists of a resin not substantially less than 15% nor more than about 35% by weight of the composition which further includes dispersed metallic material within the binder and forming the electrically conductive component of the solderable material. A solderable surface layer (15) of the conductive layer (13) includes exposed metallic material suitable for solder bonding terminations (16) to the conductive layer (13), such solderable surface layer (15) being adhesively joined to the binder by means of the organic matrix.

13 Claims, 8 Drawing Figures

PAINT APPLICATION (SCREEN PRINTING, SPRAYING, ETC)

CONDUCTIVE PAINT, NOT YET SOLDERABLE

2a. INTEGRAL OR POST CURE HEAT TREAT

SURFACE RENDERED SOLDERABLE

SOLDERABLE CONDUCTIVE EMPLOYING AN ORGANIC BINDER

DESCRIPTION

Technical Field

This invention relates to solderable materials containing organic binders and dispersed metallic particles which render the materials electrically conductive. The solderable material containing the organic binder, is readily bonded to an inorganic or organic substrate. The surface of the material is the functionally solderable portion of the material which is employed in the form of a coating.

Background Art

The concept of using an organic binder in combination with conductive metallic particles to form a solderable coating is not new. However, the difficulty in the past is that only very low levels of binder could be employed. Binder levels beyond approximately 10% by weight completely encapsulate the metal filler, rendering the coating unsolderable. While coatings containing less than 8% to 10% binder may be solderable, there is not sufficient binder present to effect either an adequate adhesion to the substrate or produce a solderable layer by which bonding can occur with a termination. As a result, the provision of organic binders serving the function of both securement to a substrate and a subsequent soldering to terminations has been effectively frustrated in the art. See Muntzer et al. U.S. Pat. No. 3,986,889 entitled "Method of Producing a Mixture of Bitumen and Subdivided Solid Mineral Matter," issued Oct. 19, 1976 and Cuthbert U.S. Pat. No. 3,832,242 entitled "Brazing and Solder Compositions Comprising a Chelating Agent," issued Aug. 27, 1974.

Accordingly, it is one of the principal objects of the present invention to produce a lamination comprising an organic binder which will effectively receive and maintain in proper disposition a number of metallic components which are dispersed within the binder or matrix and which will serve as the electrically conductive component of the lamination. It is the function of the organic binder to effectively fuse or create a bond with either an organic substrate or an inorganic substrate whereby the bulk of the binder will tolerate the normally encountered temperatures of both fusion and soldering. The binder and metallic particles together form a lamination with a surface which can be secured to a termination by soldering. The termination, once soldered to the surface of the lamination, will provide part of an electrically conductive path through the dispersed metallic particles of the lamination either to an active electrical component on the substrate or through printed circuits to other active components also mounted on the substrate.

The foregoing occurs with a binder which is present in sufficient amount to serve as an effective bonding agent and also to make a continuous phase for the metallic particles which are dispersed therein. At the same time such binder is not present in an amount to detract from the effective electrical conductivity of the lamination.

DISCLOSURE OF THE INVENTION

The present invention consists essentially of a binder or matrix consisting of various cycloaliphatic epoxies which do not readily char at temperatures significantly above the recommended cure temperature. An example of such a cycloaliphatic epoxy is a binder consisting of 3, 4 epoxycyclohexylmethyl-3, 4-epoxycyclohexane carboxylate which is cured with an acid anhydride material such as hexahydrophthalic anhydride, phthalic anhydride, or tetrahydrophthalic anhydride. This resin is then combined with a solderable metal powder, as for example gold, silver, platinum, palladium, and the like, the metal powder comprising 65% to 85% by weight of the composition. The mixture is then printed onto a substrate to form a lamination and heat cured at a temperature such that there will be a slight pyrolitic decomposition at the surface of the lamination wherein the reaction products of the binder and air are volatile and thereby exposing sufficient metallic particles to render the lamination solderable with a termination. Soldering can occur either by solder dipping or by employing a soldering iron. The optimum binder is one which consists of 30% by weight, but the binder may be as high as 35% by weight. When above approximately 35% by weight, the material as a whole becomes less conductive and therefore less effective. Significant loss of adhesion occurs with binder levels below 15% by weight. The corresponding volume percentage of the binder is 59.8% volume and 83.42% volume so that although the binder is volumetrically substantially greater than the metallic particles which serve as the electrically conductive components, the percent by weight of the binder is from not substantially less than 15% nor substantially more than 35% by weight of the composition.

The best mode for using the invention is to apply the conductive paint to a substrate, then properly cure the paint while exposed to atmosphere which selectively depletes the binder content at the surface to expose solderable metallic particles for subsequent solder treatments. The curing may be accomplished at a high enough temperature so that the surface only of the paint is selectively vaporized to expose the solderable metallic particles; alternatively, the curing may be at standard temperature and then the paint subjected to a post cure heat treatment sufficient to vaporize the lamination surface and expose the solderable metal particles.

BEST MODE FOR CARRYING OUT THE INVENTION

Figure 1:
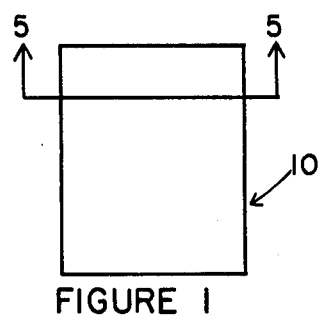
FIGS. 1, 2, 3, and 4 are progressive views illustrating the progressive development of the lamination and subsequent lead soldering.
Figure 2:
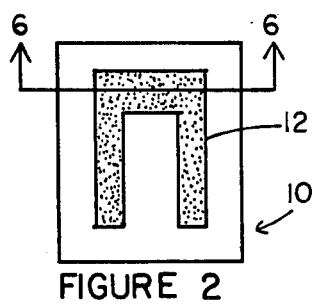

Referring to the drawings, there is illustrated a substrate designated generally by reference numeral 10. The substrate may consist of either metallic or nonmetallic material. One of the advantages of the present invention, however, is that the substrate in the present disclosure may consist of a nonmetallic material such as a polyamic acid resin, a carboxylic, an epoxy, a polyester or polyimide type resin composition. In brief, it is one of the main features of the present invention that a soldered termination may be made to a wider class of substrates than heretofore possible. The substrates may include but are not limited to, such inert substrates as plastic substrates, ceramic substrates, or a metallic substrate having a lamination of inert material such as procelain or the like. Another advantage of the present invention is that by using an organic binder material, it is possible to solder to substrates which could not stand the temperature required to apply conventional cermet solderable coatings without in any way degrading either the paint or the substrate to achieve this described binding. A low bonding temperature has a further advantage in that it is possible to use a class of substrates which was not previously usable and that such classes of substrates now obtainable are much less expensive, are lighter, have thermal properties which the ceramic materials could not achieve or be expected to achieve.

Once the paint is applied to the surface of the substrate, it is heated to form a fusion bond to the substrate and polymerize the binder which has dispersed uniformly therein a plurality of metallic elements serving as the conductor component of the lamination. The fused lamination 13 has a lead or leads 16 applied to it by means of a solder layer 14, thus forming an electrically conductive connection from the lead 16 through the solder layer 14 to the particulate metal material which is dispersed within the fused lamination.

An important feature of this invention is that the binder, while not totally pyrolitically decomposed during curing and adhesion to the substrate, is either (a) during curing or (b) after curing but prior to soldering, decomposed sufficiently so that there is a surface only decomposition of the binder sufficient to expose metallic particles readily solderable to a termination. In this respect, the binder serves as an ablation material at the surface layer 15 of the lamination 13, thereby providing a surface that is solderable.

SELECTED WORKING EXAMPLES

The paint layer may consist of various cycloaliphatic epoxies which have the characteristic of leaving no residue when they are heated to the point of oxidizing. The present invention may include a 3, 4 epoxycyclohexylmethyl-3, 4-epoxycylochexane carboxylate cured with various acid anhydrides such as hexahydrophthalic anhydride, phthalic anhydride, tetrahydrophthalic anhydride. The resin comprises 15% to 35% of the solderable material which consists of a solderable metal material as for example silver, palladium, platinum, and the like. The composition, once having been formulated and applied, is cured under a two step process at a temperature of approximately 165° C. to be followed by a 30 second to 5 minute cure at a much higher temperature of 300° C. to 400° C. or the cure can occur at approximately 200° C. in a one step process, leaving a surface layer 15 having an ample exposure of the metallic material to form an electrical and mechanical connection with a solder layer 14. The cured formulation is then heated to soldering temperature for the adhesion of the solder layer 14 to which a lead 16 is attached.

At the solder temperature, the surface layer 15 of the organic lamination 13 degrades slightly, but not extensively, during the brief time necessary to apply the solder layer 14. There are sufficient metallic particles within the lamination 13 to form an electrical connection to any component or electrical path at the substrate 10. Cycloaliphatic epoxies are readily useable in the present invention and degrade only generally upon arcing. They are utilized to provide stand off transformer insulators in the prior art, but are useable in the present invention only as part of the paint layer. The principal feature of the present invention as described, is the utilization of an organic compound which will thermally degrade, but only at predetermined temperatures and then only at the surface layer so as to expose sufficient metallic particles for combination with the solder layer. The decomposition occurs by forming carbon dioxide and water and leaves no residue, thus exposing the metal components to the solder.

In the formulations thus produced, there is a resistivity less than 0.5 ohms/sq. with a curing temperature of approximately 200° C. in the one step process. The metallic components of the lamination are solderable and the lamination, even at the soldering temperature, retains good adhesion relative to substrates such as Mylar, ceramic, and such other substrates as previously described.

Another example of the invention is binder comprised of: 47.36% cycloclyphalic epcy-1, 52.64% hexahydropthalic anhydride, and 25.02 grams flake silver, the silver being 75% by weight of the total composition. The cure occurs at: (a) 125° C. for 1.5 hours followed by 200° C. for 4 hours or, (b) the cure may be for 1.5 hours at 125° C. followed by 3 hours at 175° C. A post cure heat is for 4 minutes under a infrared lamp at about 400° C.

Process

Figure 3:
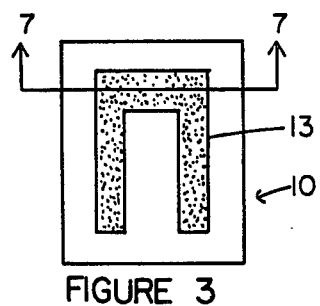
Figure 4:
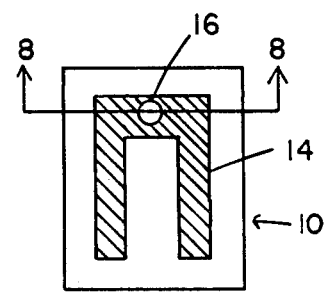
Figure 5:
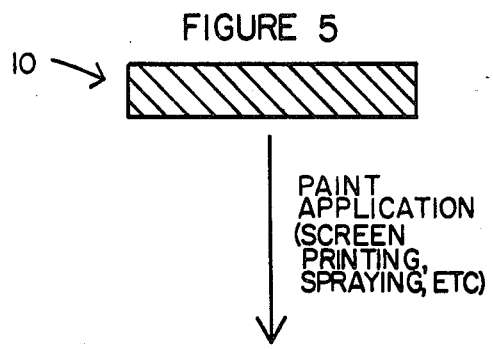
FIGS. 5, 6, 7, and 8 are section views taken on the respective section lines 5—5 of FIG. 1, 6—6 of FIG. 2, 7—7 of FIG. 3, and 8—8 of FIG. 4.
Figure 6:
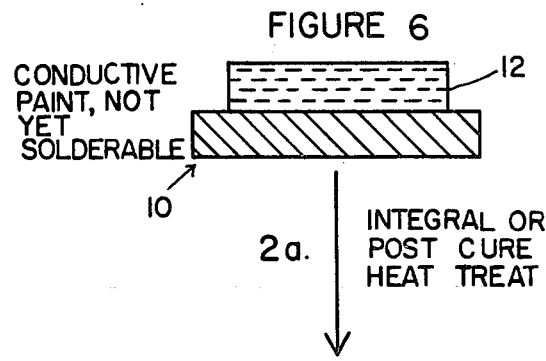
Figure 7:
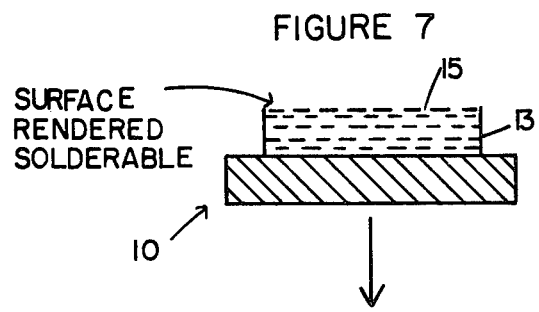
Figure 8:
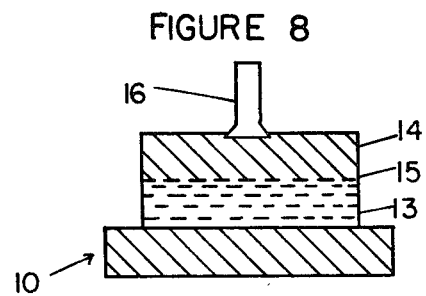

Referring to the drawings, the substrate 10 is painted with an organic binder having dispersed therein metallic components which make the paint 12 electrically conductive. The paint 12 is then cured at a high enough temperature so that the surface of the paint is vaporized to expose the solderable metallic particles, this one step process illustrated by FIG. 3 and occurring at a cure temperature of 200° C. Alternatively, the curing may be at standard temperature (the 165° C. temperature order for curing generally recommended by manufacturers) and then the paint subjected to a post cure heat treatment (see arrow 2a) sufficient to vaporize the surface layer 15 and expose solderable metal particles. After curing, there is then added a layer of solder 14 and a lead 16. Thus, there is formed on the substrate 10 a fused paint 13 and the lead 16 is then adhered to it by a solder layer 14.

The objects of the invention are thus attained, which is to solder a lead to a nonmetallic substrate consisting of plastic, ceramic, Bakelite, quartz, etc., and the lead is electrically bonded with more than ample adhesion between the lamination and the substrate. There are solderable particles dispersed in the thermoset organic binder applied to the substrate, and the final bond strength is obtained by the adhesion of the paint layer to the substrate. As low as 15% by weight of organic binder or matrix is ample to provide good adhesion and still adequately bond the metallic particles; the percent by weight of the epoxy binder or matrix can be as high as 35% by weight. The volume of the materials are quite different, however, in that the nonconductive epoxy may consist from approximately 60% to 83.5% by weight volume. The paint is generally cured at standard temperature, maintaining the cure temperature from 3 hours to 12 hours, and then a post cure heat treatment at a temperature significantly higher than the cure temperature renders the surface of the paint solderable. Alternatively, a one-step heating process at a temperature of at least 200° C. with the binder system cited above will render the paint solderable. The lead is attachable to the substrate either by solder dipping or by employing a soldering iron. When silver is the main component of the lamination, a solder containing 2% silver is employed to increase solder leach resistance.

Industrial Applicability

This invention is used to produce paints containing organic binders to which conductive terminations may be adhered by soldering.

Conclusion

Although the present invention has been illustrated and described in connection with selected example embodiments, it will be understood that this is illustrative of the invention, and it is by no means restrictive thereof. It is reasonably to be expected that those skilled in the art can make numerous revisions and additions to the invention and it is intended that such revisions and additions will be included within the scope of the following claims as equivalents of the invention.

I claim:

1. A solderable conductive composition forming a conductive layer on a substrate and suitable for forming an adhesive bond with solder, comprising a solderable material including an organic, generally pyrolytically decomposed-at-the-surface-only cycloaliphatic epoxy binder and comprising not less than 15 percent and not more than 35 percent by weight of the composition forming said solderable material, a plurality of discrete metallic particles dispersed within said binder for forming an electrical connection between said conductive layer and solder, and a solderable surface layer of said conductive layer characterized by a continuous phase of metallic particles readily bondable with solder and said surface layer rigidly affixed to the subjacent material by said binder.

2. The composition of claim 1, wherein said binder is a thermosetting resin.

3. The composition in accordance with claim 1, in which said conductive layer is rigidly adhered to a substrate by said binder and said substrate comprises a plastic or ceramic substrate.

4. The composition in accordance with claim 1, in which said resistivity is less than 0.5 ohms/sq.

5. The composition in accordance with claim 1, in which the cure temperature is less than 300° C.

6. The composition in accordance with claim 1, further comprising a substrate adhered to said conductive layer, said substrate selected from the group consisting of ceramic, plastic and quartz.

7. The composition in accordance with claim 1, further comprising a conductor joined by solder to said solderable surface layer to effect an electrical path between the conductive layer and said conductor.

8. A method for producing a solderable conductive layer on a substrate, comprising the steps of (a) mixing together cycloaliphatic epoxy binder and particulate metallic materials which serve as the conductive component of said layer wherein said metallic materials comprise 65% to 85% by weight of said mixture, (b) selectively disposing such composition onto a substrate, with said binder providing the adhesive agent between said substrate and the composition, (c) curing said composition to a heat hardened condition which is both stable and substantially inert, and (d) pyrolytically decomposing a surface layer of said composition by effecting pyrolytic decomposition at the surface only of said composition to provide for solderable adhesion of an electrically conductive termination to said surface layer.

9. The process in accordance with claim 8, wherein said binder forms an adhesive bond between the solderable surface layer and the underlying composition.

10. The process in accordance with claim 8, including the step of forming a solder bond between a conductive termination and the conductive particles within said solderable surface layer to form an electrical connection between said conductive layer and termination.

11. The process in accordance with claim 8, wherein step (c) comprises a one step curing of the composition at a temperature of at least 50° C. higher than the conventional curing temperature.

12. The process in accordance with claim 8, wherein step (c) and (d) comprise two steps consisting of an initial cure at the conventional curing temperature followed by a further cure consisting of heating at a further elevated temperature and time whereby the binder as a whole is not pyrolytically decomposed but the composition surface is decomposed to render it solderable.

13. An article constructed in accordance with claim 8, which is formed by said process and is characterized in that the surface layer is pyrolytically decomposed, and said article includes a solder bond between said surface layer and a termination selectively attached.

* * * * *